(12) United States Patent
Kashima et al.

(10) Patent No.: US 11,008,798 B2
(45) Date of Patent: May 18, 2021

(54) SAFETY DOOR SWITCH

(71) Applicant: Keyence Corporation, Osaka (JP)

(72) Inventors: Hiroshi Kashima, Osaka (JP); Lye Tatt Cheah, Osaka (JP)

(73) Assignee: KEYENCE CORPORATION, Osaka (JP)

( * ) Notice: Subject to any disclaimer, the term of this patent is extended or adjusted under 35 U.S.C. 154(b) by 260 days.

(21) Appl. No.: 16/270,612

(22) Filed: Feb. 8, 2019

(65) Prior Publication Data

US 2019/0316405 A1    Oct. 17, 2019

(30) Foreign Application Priority Data

Apr. 13, 2018   (JP) .............................. JP2018-077635

(51) Int. Cl.
| | |
|---|---|
| *E05F 15/632* | (2015.01) |
| *H01H 3/16* | (2006.01) |
| *G06K 7/10* | (2006.01) |
| *H02J 50/80* | (2016.01) |

(52) U.S. Cl.
CPC ........ *E05F 15/632* (2015.01); *G06K 7/10099* (2013.01); *H01H 3/161* (2013.01); *H02J 50/80* (2016.02)

(58) Field of Classification Search
None
See application file for complete search history.

(56) References Cited

U.S. PATENT DOCUMENTS

| | | | |
|---|---|---|---|
| 6,409,083 B1 | 6/2002 | Link | |
| 8,494,680 B2 | 7/2013 | Sparenberg et al. | |
| 2007/0204662 A1* | 9/2007 | Pullmann | E05B 15/101 70/277 |
| 2018/0238490 A1* | 8/2018 | Hahn | H03K 17/9512 |
| 2018/0266147 A1* | 9/2018 | Haussler | G06K 7/10366 |
| 2018/0292045 A1* | 10/2018 | Mailander | F16P 3/08 |

FOREIGN PATENT DOCUMENTS

JP            5964687 B2      8/2016

OTHER PUBLICATIONS

U.S. Appl. No. 16/270,613, filed Feb. 8, 2019 (72 pages).

* cited by examiner

*Primary Examiner* — Kristy A Haupt
(74) *Attorney, Agent, or Firm* — Kilyk & Bowersox, P.L.L.C.

(57) ABSTRACT

To improve toughness of a non-contact type safety door switch. A safety switch includes a metallic casing integrated as a first part of an enclosure, having an opening in a front side, a cover integrated as a front part of the enclosure, covering the opening, the cover having a surface as a front surface of the enclosure, a wireless means, a determination means, an output means, circuit substrates provided inside the metallic casing and the cover, on which the wireless means, the determination means and the output means are mounted, and attachment holes on a side surface of the metallic casing, the side surface being adjacent to the front surface of the enclosure for attaching the casing.

12 Claims, 14 Drawing Sheets

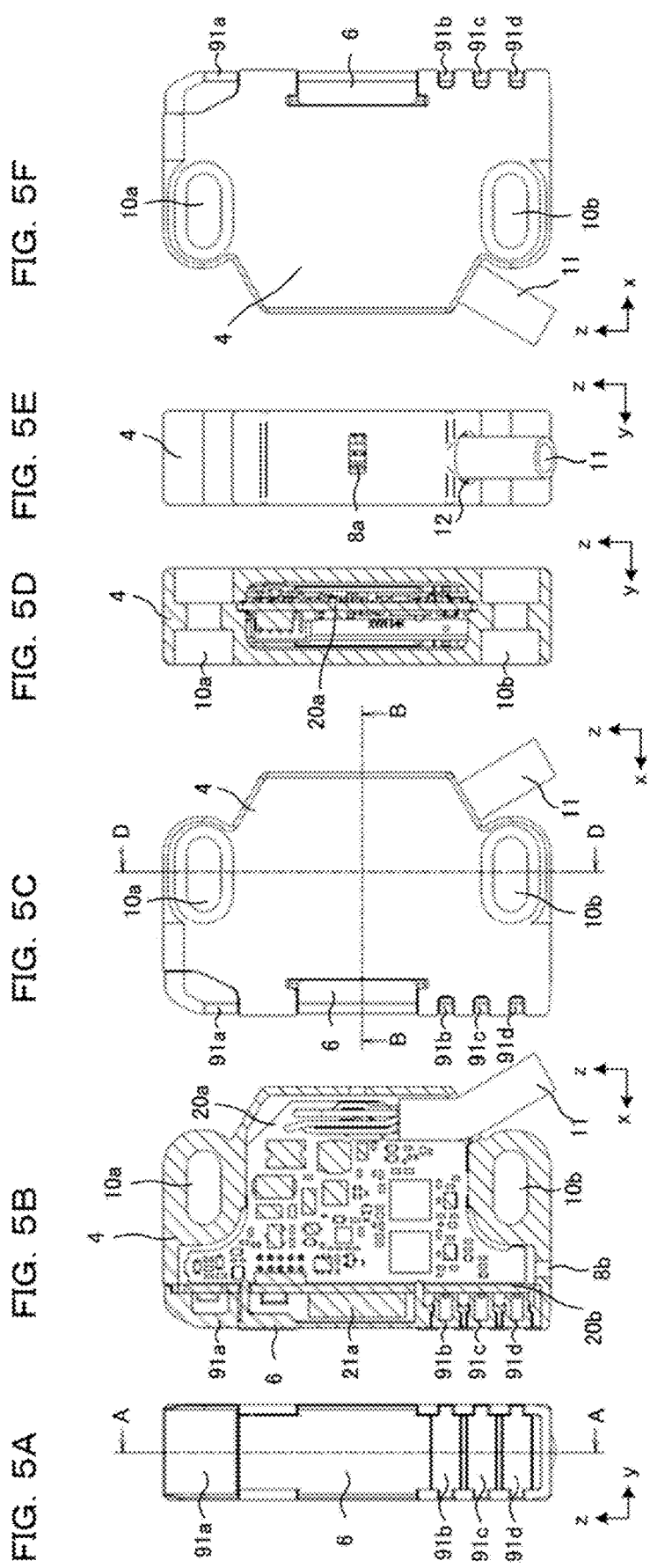

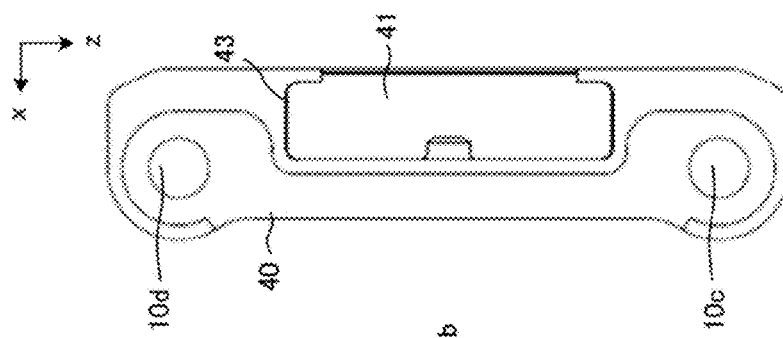
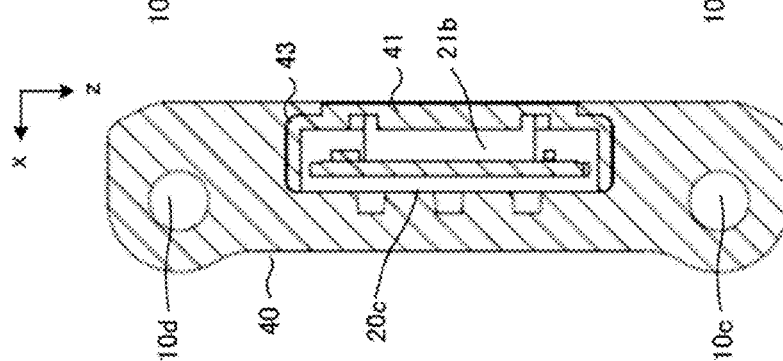
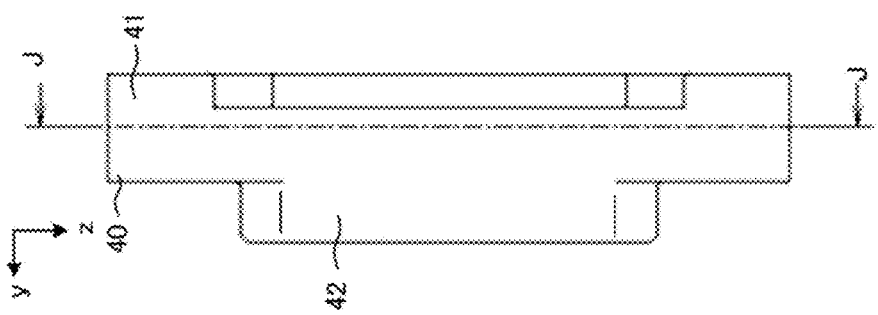
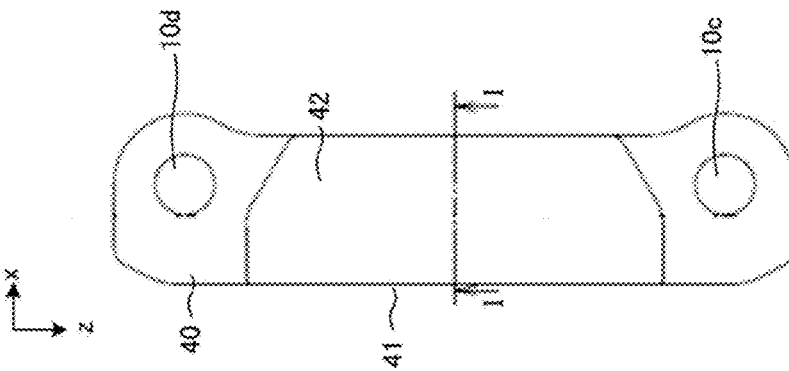
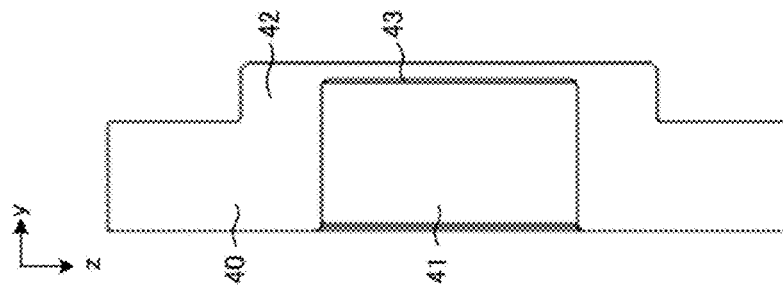

SAFETY DOOR SWITCH

CROSS-REFERENCE TO RELATED APPLICATIONS

The present application claims foreign priority based on Japanese Patent Application No. 2018-077635, filed Apr. 13, 2018, the contents of which is incorporated herein by reference.

BACKGROUND OF THE INVENTION

1. Field of the Invention

The present invention relates to a safety door switch.

2. Description of Related Art

In order to avoid contact with a hazard source by an operator at a factory or the like, the hazard source is surrounded by a fence or a cover. In the fence, a door through which the operator enters and exits is provided. Moreover, a safety switch is provided in the door. The safety switch is a switch that locks the door while the hazard source is operated and that releases locking of the door when the hazard source is stopped.

That is, the safety switch maintains a stopped state of the hazard source while the door is opened and shifts the state of the hazard source to an operable state when the door is closed. According to JP-T-2002-501698 (Patent Literature 1) and JP-A-2011-058354 (Patent Literature 2), detection of opening/closing of the door using the principle of electromagnetic induction is proposed.

SUMMARY OF THE INVENTION

Incidentally, the safety door switch is classified into a contact type and a non-contact type. The contact type includes a safety door switch body (sensor unit) and an actuator having a bolt. The contact type determines that the door is closed when the bolt is inserted into the sensor unit. As the sensor unit may contact the bolt, the sensor unit has a metallic casing. On the other hand, the non-contact type includes a safety door switch body (sensor unit) and an actuator. The sensor unit measures a distance to the actuator by performing communication with the actuator and determines opening/closing of the safety door. As electromagnetic waves are used for communication, a casing of the sensor unit and a casing of the actuator of the non-contact type are both made of resin. The sensor unit in the non-contact type does not contact the actuator in principle. However, the sensor unit is installed in a door frame, therefore, a user or a machine tool passing through an entrance of the door may contact the sensor unit. In view of the above, an object of the present invention is to improve toughness of the non-contact type safety door switch.

The present invention provides, for example, a safety door switch including a metallic casing, a wireless means for wirelessly supplying electric power to a wireless tag and receiving a signal including identification information from the wireless tag, a determination means for determining whether a predetermined wireless tag exists in a reference range or not in accordance with identification information included in the signal received from the wireless tag by the wireless means and an intensity of the signal received from the wireless tag, an output means for outputting a safety signal based on a determination result of the determination means, an opening formed on a front surface as a first outer surface in plural outer surfaces forming the metallic casing so as to correspond to a wireless route by the wireless means, a cover member covering the opening, through which electromagnetic waves transmitted and received by the wireless means pass, one or more circuit substrates provided inside the casing and the cover member, on which the wireless means, the determination means and the output means are mounted and attachment holes formed on side surfaces as second outer surfaces adjacent to the front surface in plural outer surfaces forming the metallic casing for attaching the casing.

According to the present invention, toughness of the non-contact type safety door switch is improved.

BRIEF DESCRIPTION OF THE DRAWINGS

FIGS. 5A to 5F are views for explaining the body of the safety switch;

FIGS. 9A to 9E are views for explaining the actuator;

DESCRIPTION OF EMBODIMENTS

<Mechanical Structure of Safety Switch>

Figure 1A:
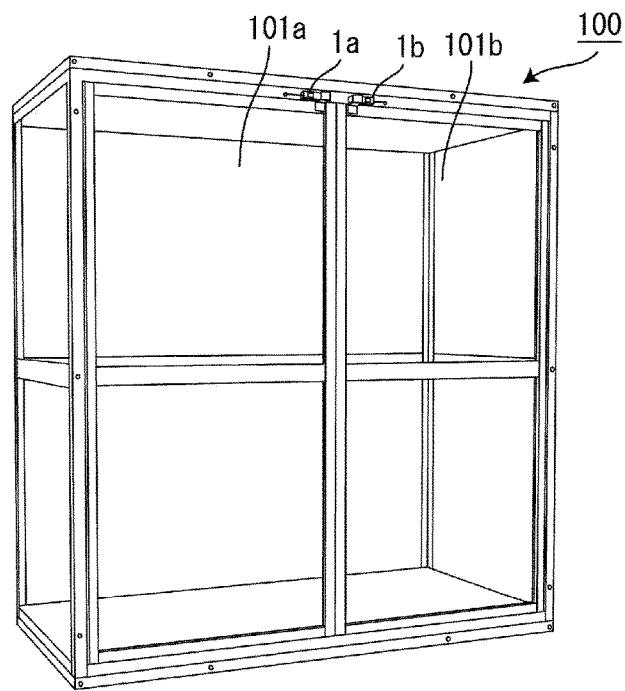
FIGS. 1A to 1C are views showing an example to which a safety switch is applied.
Figure 1B:
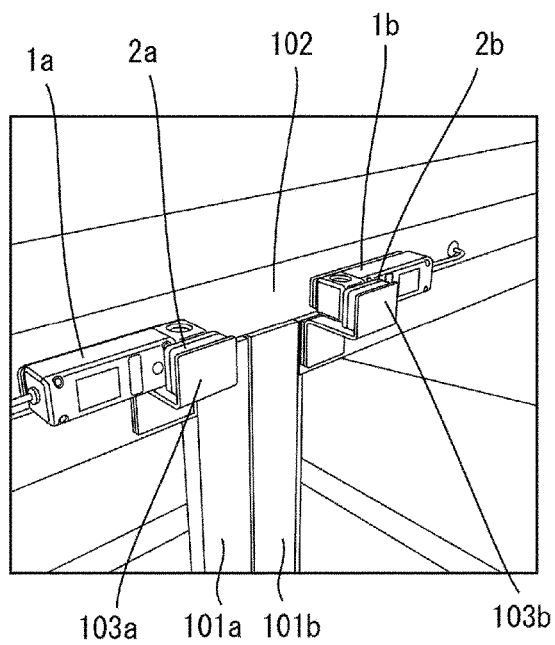
Figure 1C:
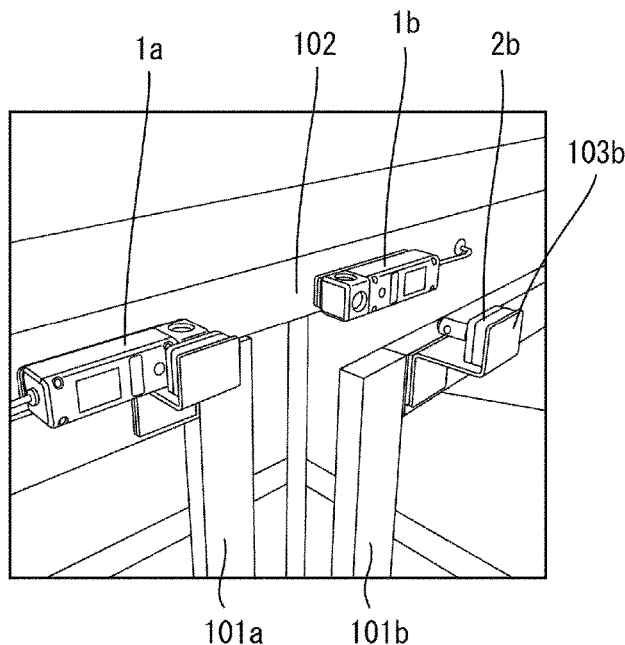

FIGS. 1A to 1C show an example to which a safety switch 1 is applied. The safety switch 1 may be called a safety door switch. In this example, a surrounding box 100 surrounding a hazard source such as a machine tool is shown. The surrounding box 100 includes a left door 101a and a right door 101b as double doors. In an upper right part of the left door 101a, a safety switch 1a is provided. In an upper left part of the right door 101b, a safety switch 1b is provided. Lowercase alphabet characters following reference numerals are used for distinguishing the same or similar plural members. In a case where items common to plural members are explained, lowercase alphabet characters are omitted. As shown in FIGS. 1B and 1C, bodies of the safety switches 1a and 1b are fixed to a door frame 102 of the surrounding box 100. An actuator 2a of the safety switch 1a is fixed to a support member 103a fixed to the left door 101a. An actuator 2b of the safety switch 1b is fixed to a support member 103b fixed to the right door 101b. As shown in FIG. 1B, when both of the left door 101a and the right door 101b are closed, the machine tool surrounded by the surrounding box 100 can be operated. As shown in FIG. 1C, when at least one of the left door 101a and the right door 101b is opened, the machine tool surrounded by the surrounding box 100 is not capable of being operated. The surrounding box 100 is just an example, and may be replaced with a combination of an iron fence and a door. In this case, the safety switch 1 is fixed to a door frame of the iron fence, and the actuator 2 is fixed to the door.

Figure 2:
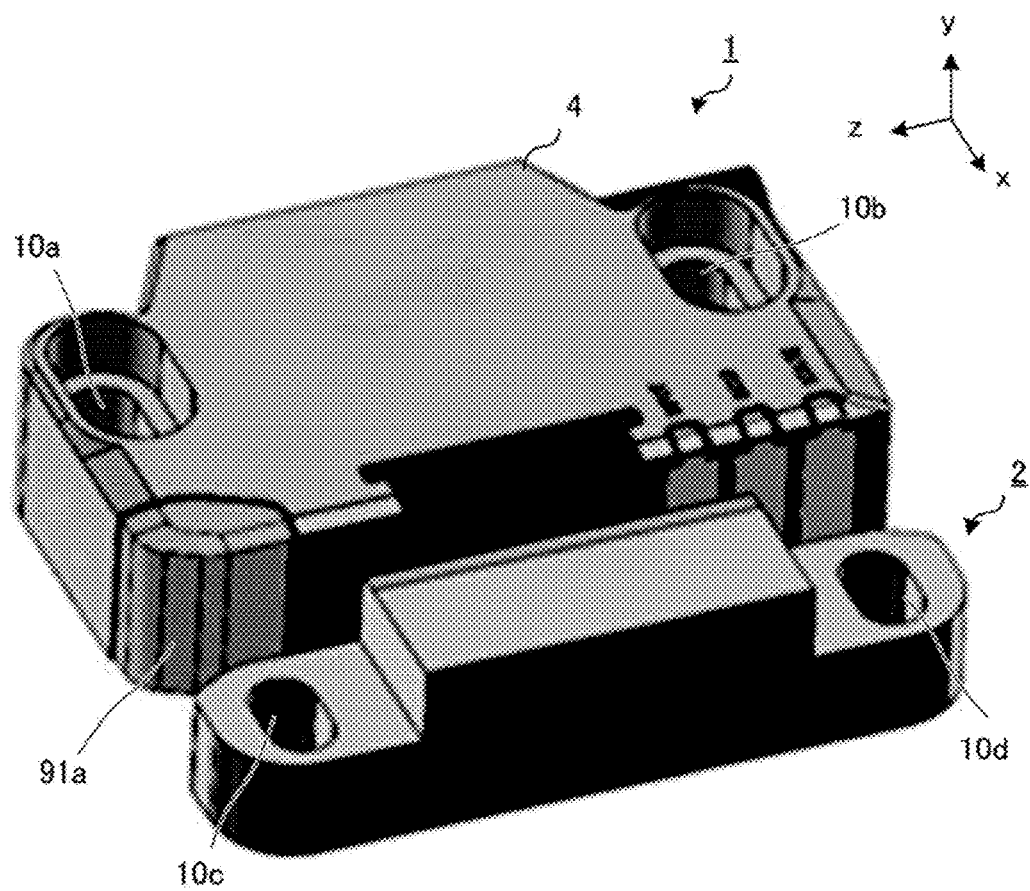
FIG. 2 is a perspective view showing a body of the safety switch and an actuator.

FIG. 2 is a perspective view showing the body of the safety switch 1 and actuator 2. The safety switch 1 is a non-contact type safety switch. When the actuator 2 comes close to the body of the safety switch 1, the safety switch 1 determines that the door 101 is closed. When the actuator 2 goes away from the body of the safety switch 1, the safety switch 1 determines that the door 101 is opened. A body case 4 is a metallic casing. Plural display lamps are provided on a front side of the body case 4. A large display lamp 91a is a display lamp indicating whether it is in a safety state or not. The safety state is a state in which the door 101 is closed. Attachment holes 10a and 10b are provided so as to pierce through a left side surface to a right side surface of the body case 4. Attachment holes 10c and 10d are provided so as to pierce through a left side surface to a right side surface of the actuator 2. Screws are inserted into the attachment holes 10a to 10d respectively. Cross-sectional shapes of the attachment holes 10a to 10d are respectively a rounded rectangular shape.

<Structure of Body>

Figure 3A:
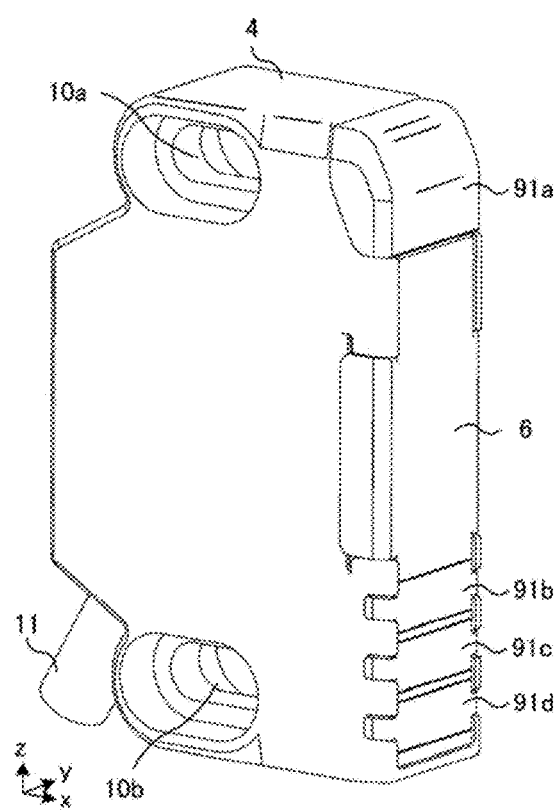
FIGS. 3A to 3D are views for explaining an external appearance of the body of the safety switch.
Figure 3B:
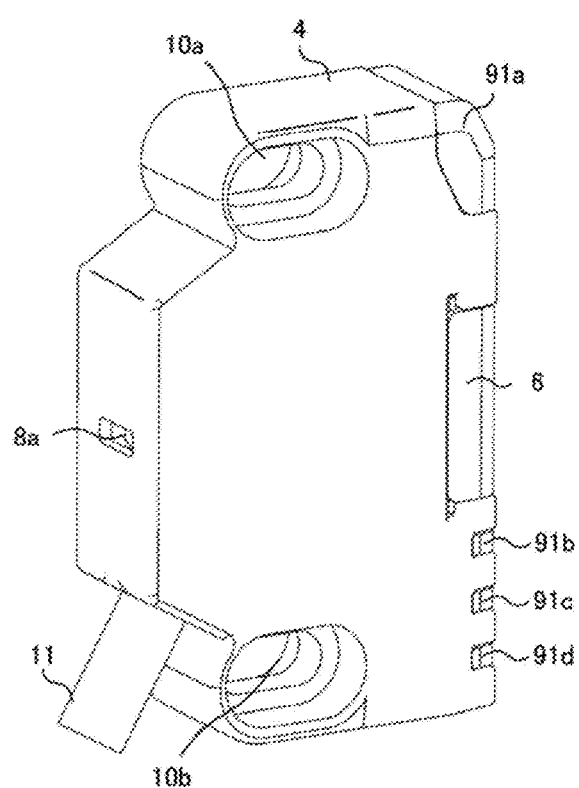
Figure 3C:
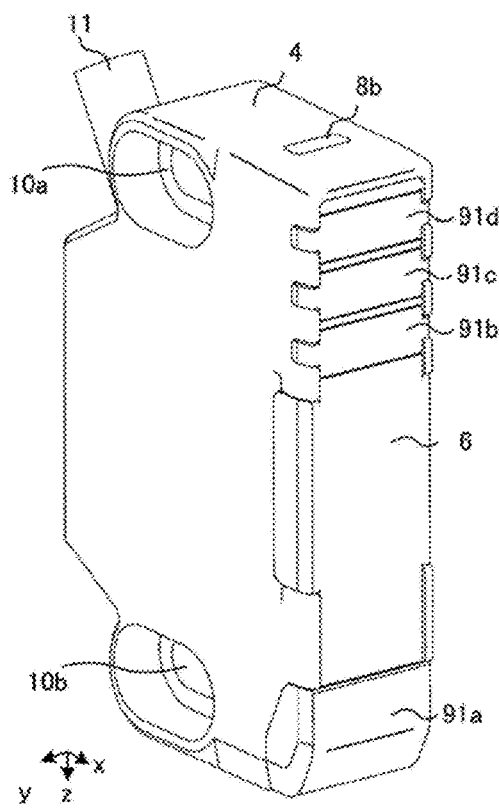
Figure 3D:
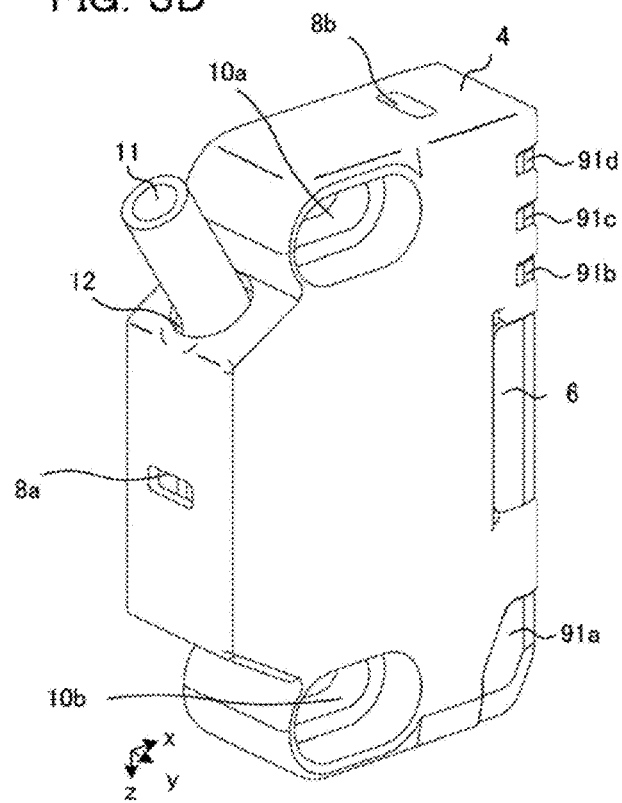

FIG. 3A is a perspective view mainly showing a right side surface, a front surface and a top surface of the body of the safety switch 1. FIG. 3B is a perspective view mainly showing the right side surface, a back surface and the top surface of the body of the safety switch 1. FIG. 3C is a perspective view mainly showing a left side surface, the front surface and a bottom surface of the body of the safety switch 1. FIG. 3D is a perspective view mainly showing the left side surface, the back surface and the bottom surface of the body of the safety switch 1.

On the front side of the body of the safety switch 1, an opening is provided and a cover member 6 is provided so as to cover the opening. The opening is covered with the large display lamp 91a and three small display lamps 91b, 91c and 91d. As shown in FIG. 3B and FIG. 3D, a plane area parallel to the front surface is provided at the center of the back surface. Slope areas are provided adjacent to the plane area. In the plane area, a filling hole 8a for filling the inside of the body case 4 with a filling resin such as hot melt is provided in the plane area. The hot melt is a generic term of adhesives of which main ingredients are thermoplastic synthetic resin or rubber and which is a solid at normal temperature. Polyamide-based hot melt or polyester-based hot melt may be adopted for improving environmental durability of the safety switch 1 and the like. The polyester-based hot melt is more excellent than the polyamide-based hot melt from the viewpoint of oil resistance and water resistance.

As shown in FIG. 3C and FIG. 3D, a filling hole 8b is also provided on the bottom surface of the body case 4. As shown in FIG. 3D, a cable hole 12 is provided in the slope area close to the bottom surface in the two slope areas. A cable 11 is inserted into the cable hole 12. The cable 11 includes a power supply line, a signal line for transmitting a safety signal and so on.

As shown in FIG. 3A to FIG. 3D, a resin member having transparency forming the large display lamp 91a exists over the front surface, the right side surface, the left side surface and the top surface of the body case 4. A resin member having transparency forming the small display lamps 91b to 91d exists over the front surface, the right side surface and the left side surface. When the door 101 is closed, the actuator 2 comes close so as to face the front surface side of the body case 4. Therefore, the front surface side of the display lamps is hidden by the actuator 2. Accordingly, the user can check states of the display lamps easily by extending the display lamps to adjacent surfaces such as side surfaces.

Figure 4:
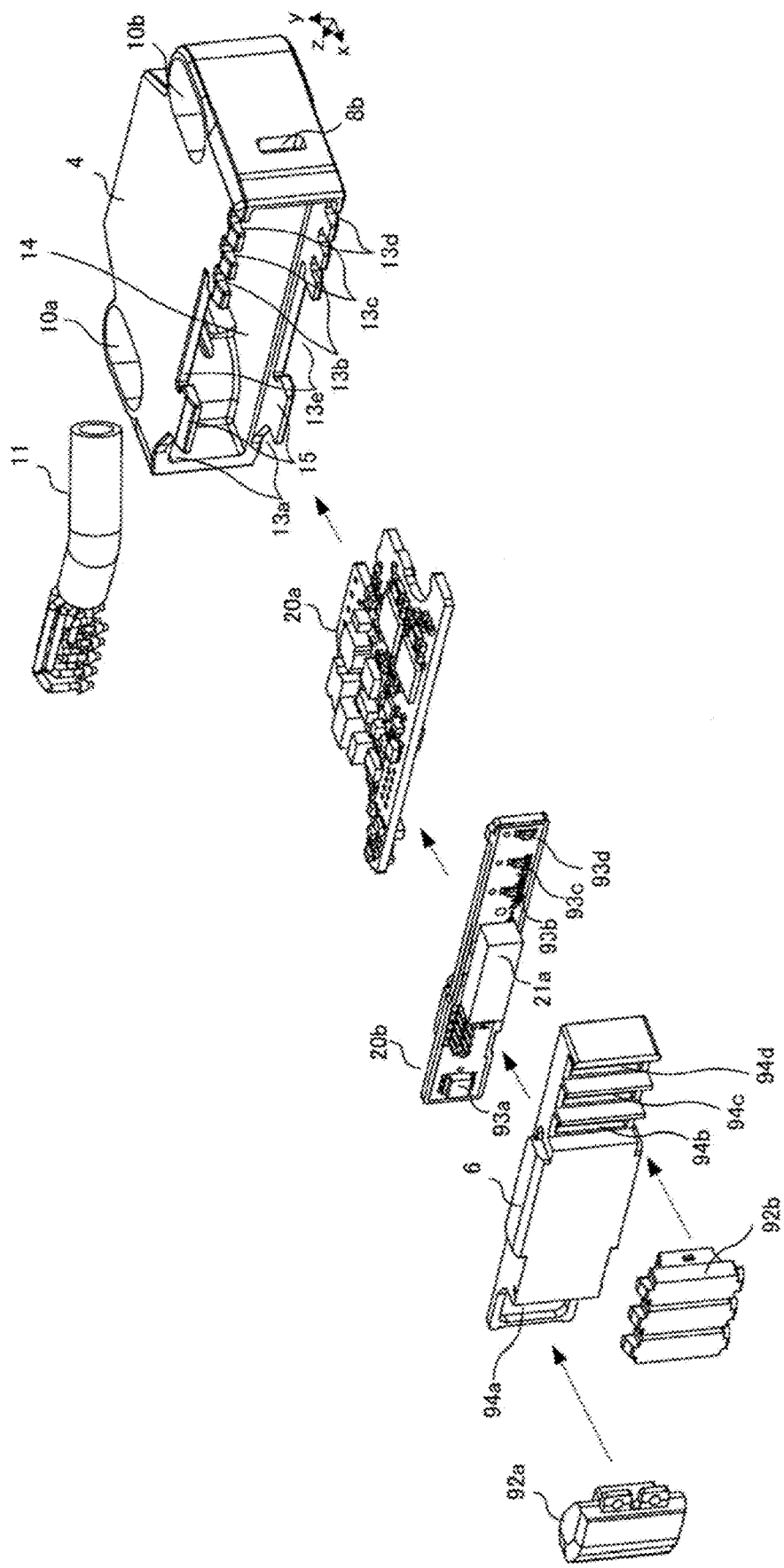
FIG. 4 is an exploded view showing the body of the safety switch.

FIG. 4 is an exploded view showing plural parts forming the body of the safety switch 1. A resin member 92a forming the large display lamp 91a is fitted to an attachment hole 94a provided in the cover member 6. A resin member 92b forming the small display lamps 91b to 91d is fitted to attachment holes 94b, 94c and 94d provided in the cover member 6. A circuit substrate 20b is arranged on a back surface side of the cover member 6. On the circuit substrate 20b, a light emitting device 93a forming the large display lamp 91a, light emitting devices 93b, 93c and 93d forming the small display lamps 91b and an antenna coil 21a are mounted. As the cover member 6 is a member (example: resin) transmitting electromagnetic waves, the cover member 6 can transmit electromagnetic waves going to the actuator 2 and electromagnetic waves coming from the actuator 2. A circuit substrate 20a is a circuit substrate having a control circuit, a power supply circuit and the like. The circuit substrate 20a is orthogonal to the circuit substrate 20b, and a side surface of the circuit substrate 20a may support a back surface of the circuit substrate 20b. A plurality of lines inside the cable 11 are soldered on the circuit substrate 20a.

An opening 14 is provided on the front surface of the body case 4. Moreover, notches 13a are provided at assembled parts of the front surface, the top surface, the right side surface and the left side surface. Notches 13b, 13c, 13d and 13e are provided at an assembled part of the front surface and the right side surface of the body case 4 and at an assembled part of the front surface and the left side surface of the body case. In particular, the notches 13a are useful for allowing the large display lamp 91a to extend over the top-surface side, the right-side surface side and the left-side surface side. The notches 13b to 13d are useful for allowing the small display lamps 91b to 91d to extend on the right-side surface side and the left-side surface side of the body case 4. A portion 15 existing between the notch 13a and the notch 13e on the left side surface of the body case 4 extends to the front surface of the body case 4. A portion 15 existing between the notch 13a and the north 13e on the right side surface of the body case 4 extends to the front surface of the body case 4. Similarly, portions existing between the notches 13e and the notches 13b, portions existing between the notches 13b and the notches 13c and portions existing between the notches 13c and the notches 13d on the two side surfaces of the body case 4 extend to the front surface of the body case 4. As these portions are made of metal, these portions are useful for maintaining strength on the front surface side of the body case 4.

FIG. 5A is a view showing the front surface of the body of the safety switch 1. FIG. 5B is an A-A cross-sectional view showing the safety switch 1. FIG. 5C is a view showing the left side surface of the body of the safety switch 1. FIG. 5D is a D-D cross-sectional view showing the safety switch 1. FIG. 5E is a view showing the back surface of the body of the safety switch 1. FIG. 5F is a view showing the right side surface of the body of the safety switch 1.

As shown in FIG. 5A, the safety switch 1 has a right and left symmetrical shape. That is for allowing both of the right side surface and the left side of the safety switch 1 to be selected as attachment surfaces. As shown in FIG. 5C, the large display lamp 91a and the small display lamps 91b to 91d extend to the left side surface. Accordingly, if the right side surface is fixed to the door frame or the like, the user can check respective display lamps from the left side surface. As shown in FIG. 5F, the large display lamp 91a and the small display lamps 91b to 91d extend to the right side surface. Accordingly, if the left side surface is fixed to the door frame or the like, the user can check respective display lamps from the right side surface.

As shown in FIG. 5B, a thickness of a portion facing the antenna coil 21a in the cover member 6 is thinner than thicknesses of other portions. Accordingly, the antenna coil 21a can be arranged close to the front surface of the body. That is, it is possible to shorten a distance between the antenna coil 21a and the actuator 2, therefore, a receiving intensity of signals by the actuator 2 and a receiving intensity of signals by the antenna coil 21a are increased.

As shown in FIG. 5B and FIG. 5E, one of the filling holes 8a and 8b may be used as a hole for injecting the filling resin and the other hole is used for releasing air inside the body case 4. Accordingly, the almost entire area inside the body case 4 will be easily filled with the filling resin.

As shown in FIG. 5D, sizes of the attachment holes 10a and 10b in an xz-direction may be different according to the position in a y-direction. That is, sizes of both end portions in a depth direction (y-direction) of the attachment holes 10a and 10b are larger than a size of a central portion. This is for accommodating heads of attachment screws. The reason why the sizes of the both end portions are large is for allowing both side surfaces of the body case 4 to be selected as attachment surfaces. In a case where the right side surface is selected as the attachment surface, the attachment screws are inserted from the left side surface toward the right side surface. In a case where the left side surface is selected as the attachment surface, the attachment screws are inserted from the right side surface toward the left side surface.

Figure 6A:
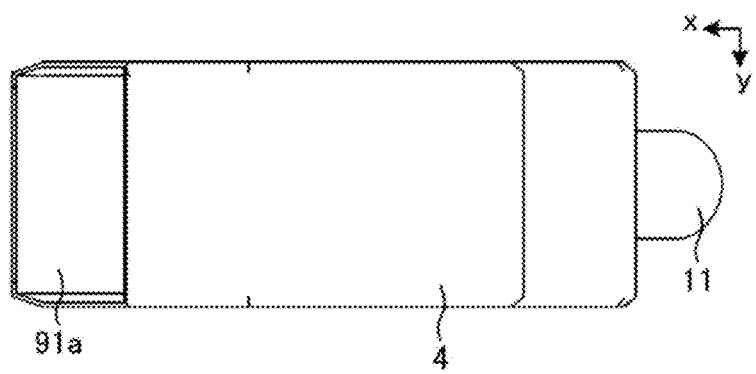
FIGS. 6A to 6C are views for explaining the body of the safety switch.

FIG. 6A is a view showing the top surface of the body of the safety switch 1. As the large display lamp 91a extends to the top surface, the user can visually recognize the large display lamp 91a also from the top surface side.

Figure 6B:
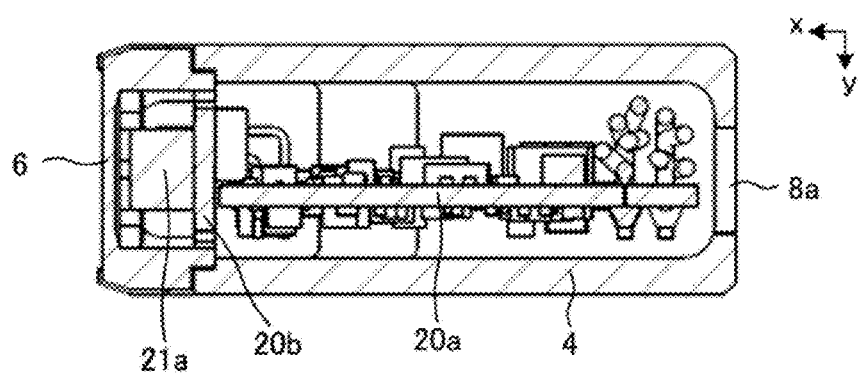

FIG. 6B is a B-B cross-sectional view showing the safety switch 1. The B-B section is as shown in FIG. 5C. Both side surfaces in the y-direction of the circuit substrate 20b are supported by the cover member 6. The circuit substrate 20a is positioned almost at the center of the body case 4. The filling resin injected from the filling hole 8a is separated to the surface side and the back surface side of the circuit substrate 20a and moves toward the circuit substrate 20b.

Figure 6C:
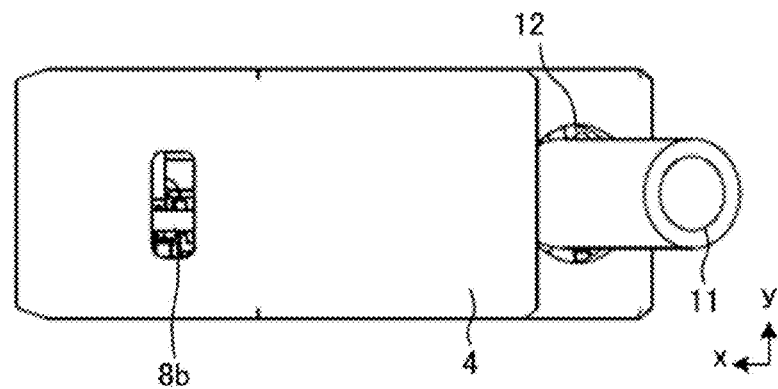

FIG. 6C is a view showing the bottom surface of the body of the safety switch 1. The cable hole 12 exists in the body case 4 and a diameter of the cable hole 12 may be larger than a diameter of the cable 12 by a given value or more. In this case, the filling resin can be injected from both of the filling holes 8a and 8b. That is because air inside the body case 4 can be released from a gap between the cable hole 12 and the cable 11. The given value may be a value enough to achieve the object of releasing air.

<Structure of Actuator>

Figure 7A:
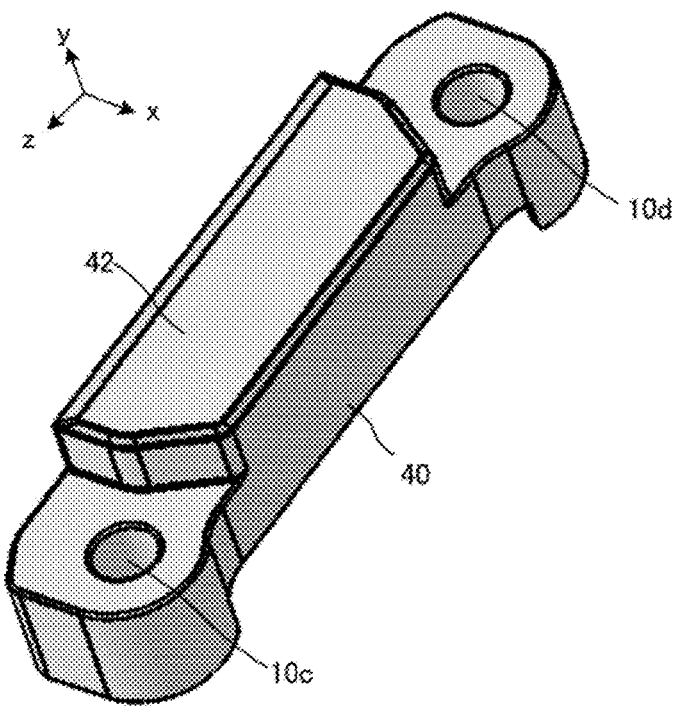
FIGS. 7A and 7B are perspective views showing the actuator.

FIG. 7A is a perspective view mainly showing a back surface and a top surface of the actuator 2. A convex section 42 exists on the top surface of the actuator 2. The convex section 42 is higher than portions where the attachment holes 10c and 10d existing at both end portions of the back surface. A difference of heights may be larger than a height of heads of attachment screws. A circuit substrate and the like are housed in the convex section 42.

Figure 7B:
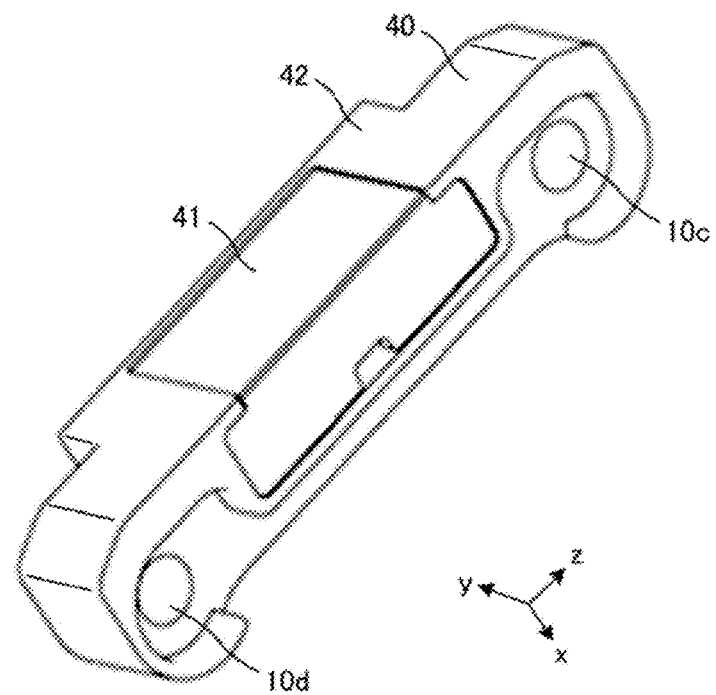
Figure 8:
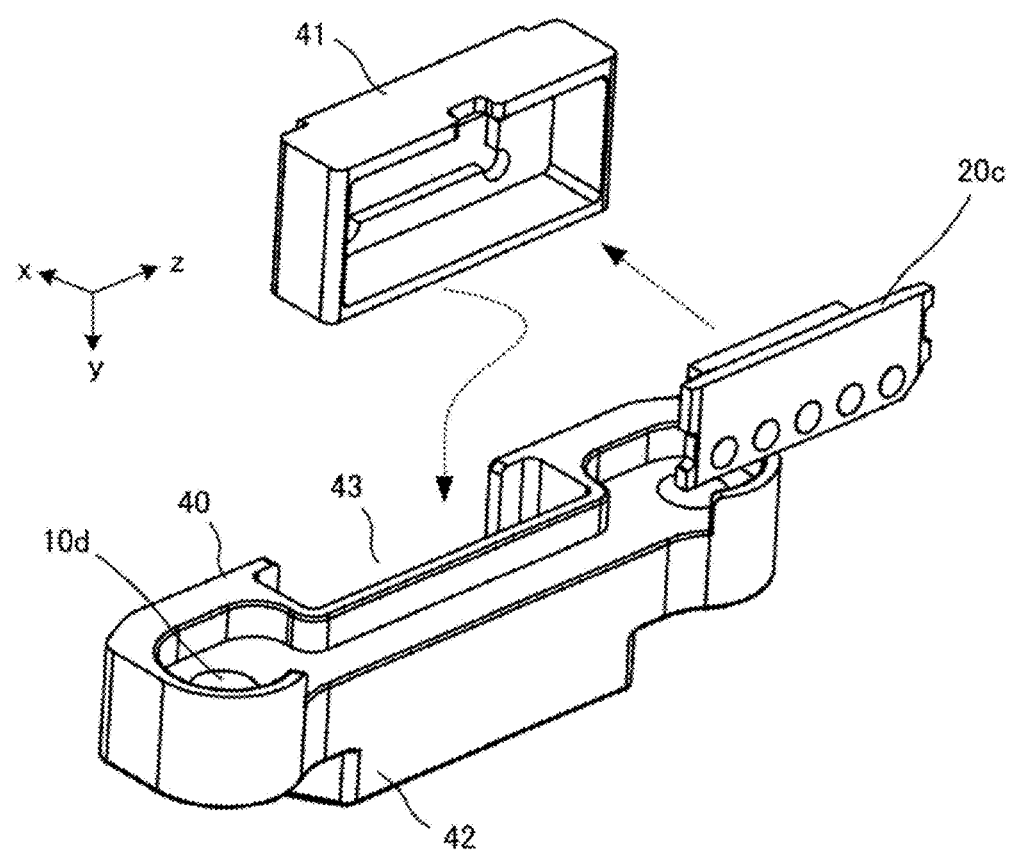
FIG. 8 is a view for explaining components of the actuator.

FIG. 7B is a perspective view mainly showing a front surface and a bottom surface of the actuator 2. FIG. 8 is an exploded view showing components of the actuator 2. A casing 40 is a metallic casing. A circuit substrate 20c is housed in a circuit case 41 formed of an electromagnetic wave transmissive material. The casing 40 has a groove portion 43 for receiving the circuit case 41. The circuit case 41 is fitted to the groove portion 43 from the bottom surface side. As shown in FIG. 7B and FIG. 8, the casing 40 extends to the back surface of the actuator 2. This is useful for increasing strength of the actuator 2.

Figure 10A:
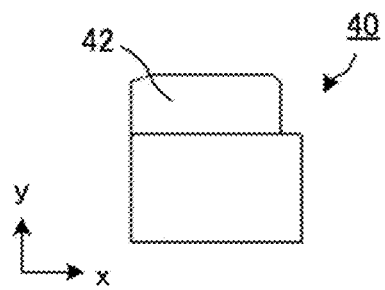
FIGS. 10A to 10C are views for explaining the actuator.
Figure 10B:
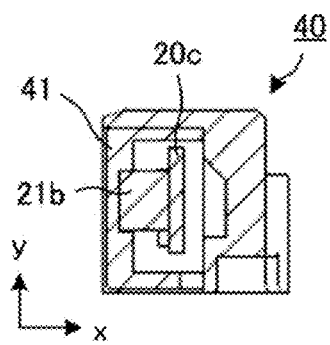
Figure 10C:
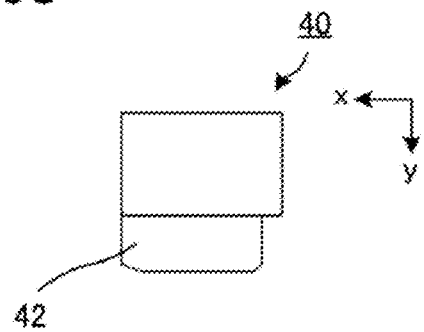

FIG. 9A is a view showing the front surface of the actuator 2. FIG. 9B is a view showing the top surface of the actuator 2. FIG. 9C is a view showing the back surface of the actuator 2. FIG. 9D is a J-J cross-sectional view of the actuator 2. FIG. 9E is a view showing the bottom surface of the actuator 2. FIG. 10A is a view showing a left side surface of the actuator 2. FIG. 10B is an I-I cross-sectional view of the actuator 2. FIG. 10C is a view showing a right side surface of the actuator 2.

As shown in FIG. 9A and FIG. 9B, the circuit case 41 does not reach the top surface. That is, the circuit case 41 housed in the groove portion 43 is protected by the top surface of the casing 40 made of metal. The groove portion 43 opens to the front surface side and the bottom surface side of the casing 40.

As shown in FIG. 9C, FIG. 10A and FIG. 10C, a step is formed on the top surface of the casing 40. As described above, a difference between a lower top surface and a higher top surface may correspond to the height of heads of attachment screws.

As shown in FIG. 9D and FIG. 10B, the antenna coil 21b is arranged close to the front surface side of the circuit case 41. Moreover, a rectangular groove for housing the antenna coil 21b may be provided in a front surface of the circuit case 41. That is, a thickness of a portion close to the antenna coil 21b in the front surface of the circuit case 41 may be thinner than thicknesses of other portions. Accordingly, a distance between the antenna coil 21b and the antenna coil 21a can be shortened and the receiving intensity of signals by the antenna coils 21a and 21b is increased.

<Fixing of Safety Switch>

Figure 11A:
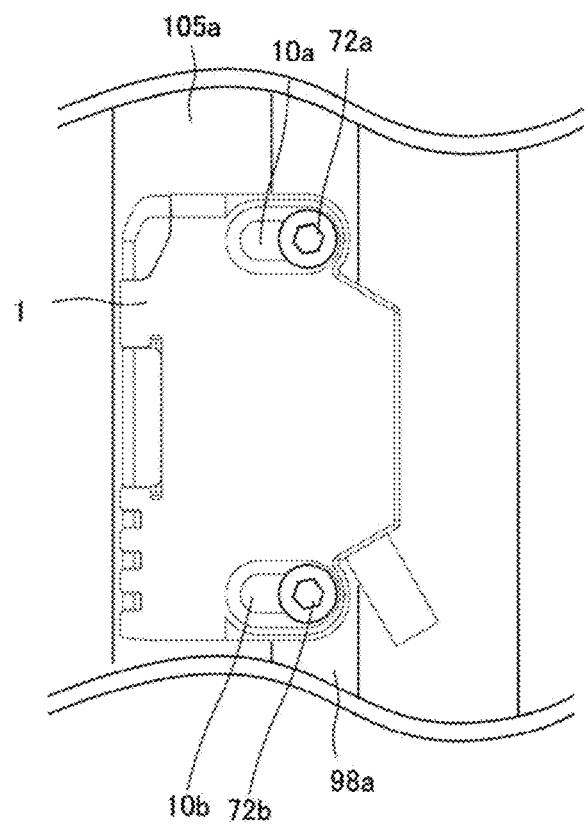
FIGS. 11A to 11C are views showing an example to which the safety switch is applied.
Figure 11B:
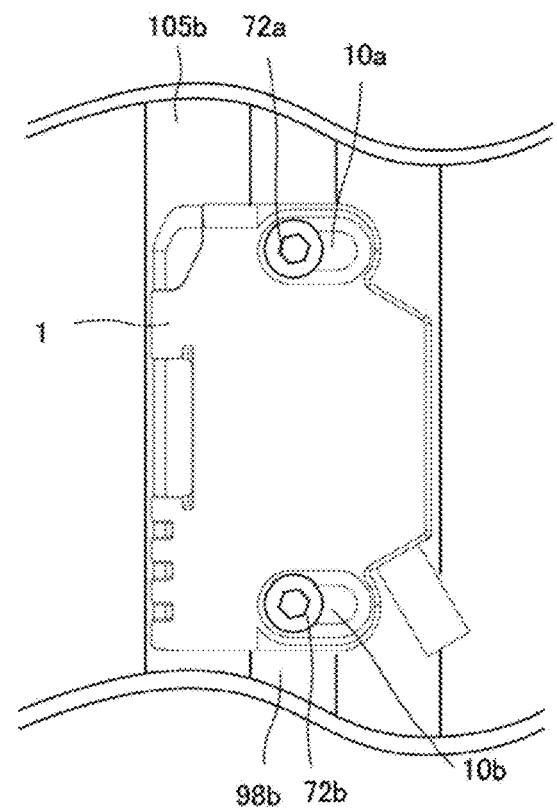
Figure 11C:
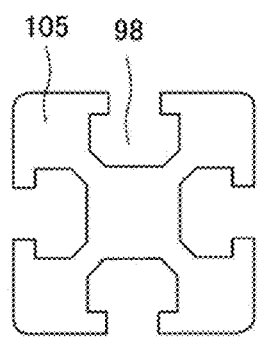

FIG. 11A shows the body of the safety switch 1 attached to a square-shaped aluminum frame 105a with 40 mm×40 mm. FIG. 11B shows the body of the safety switch 1 attached to a square-shaped aluminum frame 105a with 30 mm×30 mm. FIG. 11C shows a cross-sectional view of the square-shaped aluminum frame 105.

As shown in FIG. 11A to FIG. 11C, grooves 98a and 98b are provided in centers of four side surfaces of each of the square-shaped aluminum frames 105a and 105b. Nuts can be inserted into the grooves 98a and 98b from the bottom surface side or the top surface side of the square-shaped aluminum frames 105a and 105b. As shown in FIG. 11A and FIG. 11B, a hexagonal socket attachment screw 72a is inserted into the attachment hole 10a and screwed to the nut. Similarly, a hexagonal socket attachment screw 72b is inserted into the attachment hole 10b and screwed to the nut. As shown in FIG. 11A, the attachment screws 72a and 72b are positioned at centers of the grooves 98a and 98b. This is because the nuts are fixed to the centers of the grooves 98a and 98b. However, in the square-shaped aluminum frame 105a with 40 mm×40 mm and the square-shaped aluminum frame 105a with 30 mm×30 mm, distances from frame ends to the centers differ from each other by approximately 5 mm. Accordingly, a cross-sectional shape of the attachment holes 10a and 10b is made to be a rounded rectangle, thereby allowing the safety switch 1 to be easily fixed to plural square-shaped aluminum frames with different sizes. As a result, the front surface of the safety switch 1 can be fixed close to the actuator 2.

<Electrical Configuration of Safety Switch>

Figure 12:
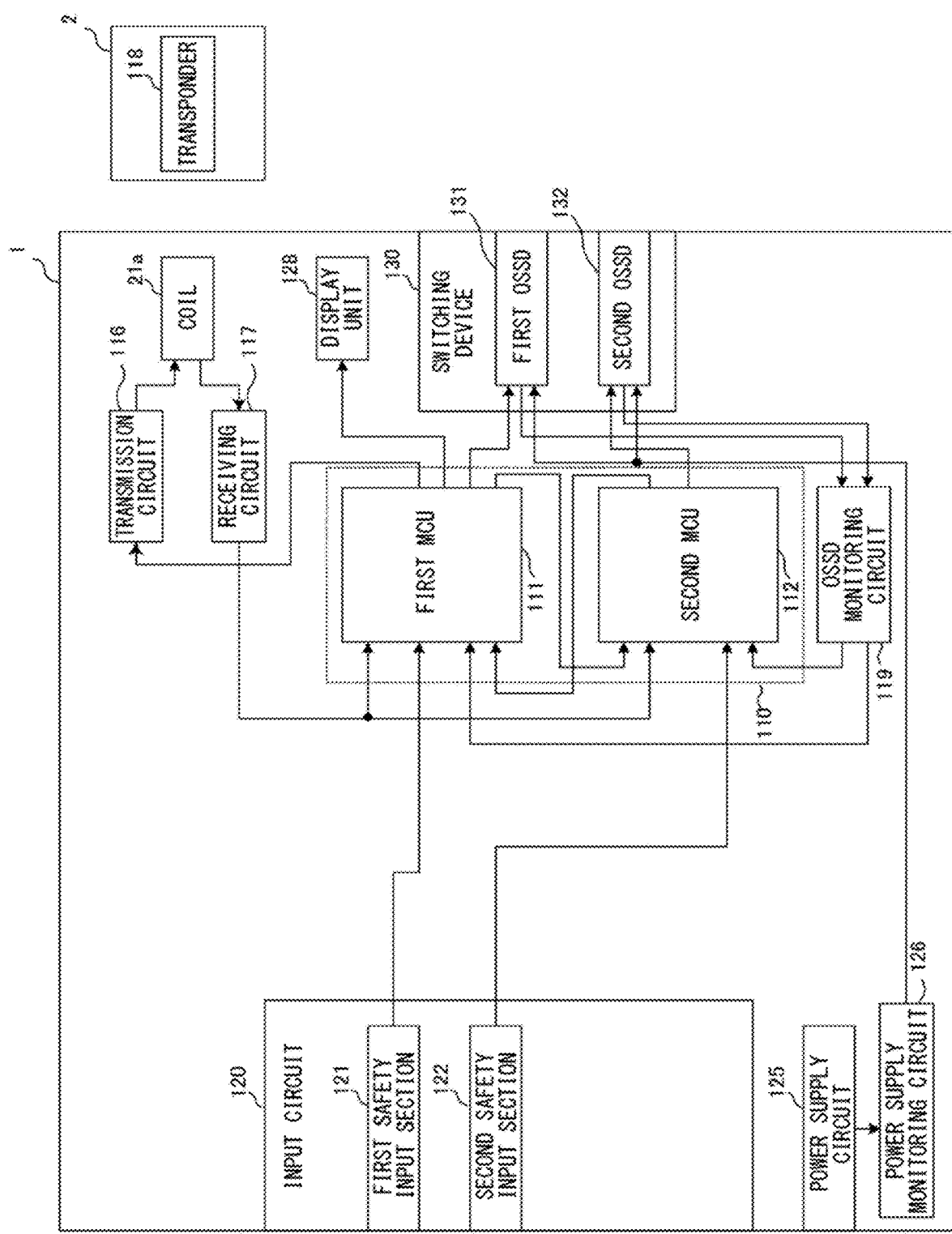
FIG. 12 is a block diagram showing an electrical configuration of the safety switch.
Figure 13:
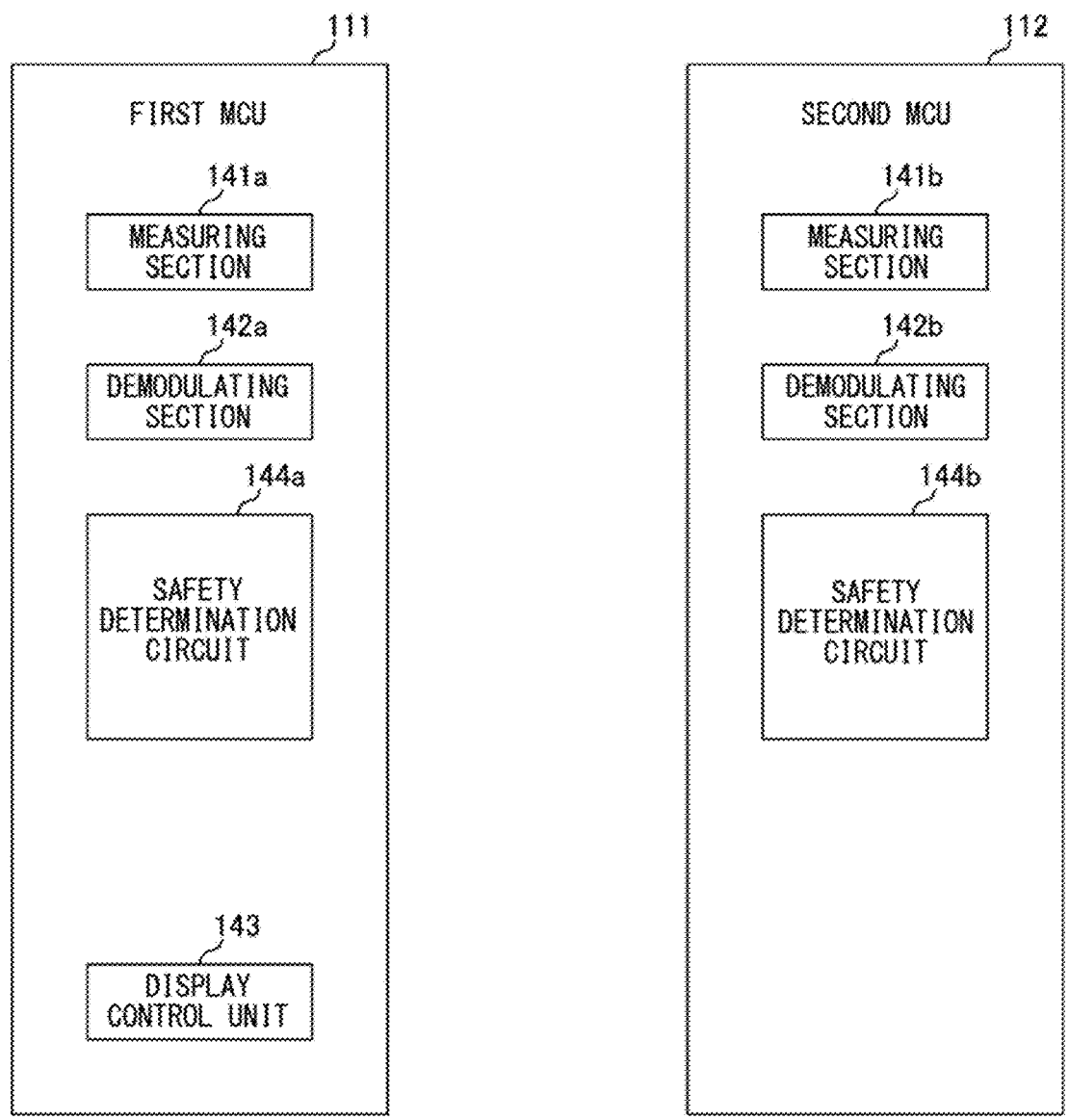
FIG. 13 is a block diagram showing functions of MCUs.

FIG. 12 shows an electrical configuration of the safety switch 1. FIG. 13 shows functions of MCUs (micro controller units). A control circuit 110 includes a first MCU 111 and a second MCU 112. The first MCU 111 and the second MCU 112 monitor each other by performing communication mutually.

The first MCU 111 is connected to a transmission circuit 116. The transmission circuit 116 is connected to the antenna coil 21a. The antenna coil 21a is connected to a receiving circuit 117. The receiving circuit 117 is connected to both of the first MCU 111 and the second MCU 112. The first MCU 111 drives the antenna coil 21a through the transmission circuit 116 to supply a wireless signal from the antenna coil 21a to a transponder 118. The first MCU 111 and the second MUC 112 receive the wireless signal from the transponder 118 through the antenna coil 21a and the receiving circuit 117. The transponder 118 includes the antenna coil 21b and a response circuit. The transponder 118 may be a wireless tag (RF-ID tag). The response circuit operates by using induction current generating in the antenna coil 21b as a power supply. The response circuit demodulates the wireless signal received by the antenna coil 21b to acquire information and further transmits a wireless signal (response signal) through the antenna coil 21b. A measuring section 141a of the first MCU 111 and a measuring section 141b of the second MCU 112 measure an intensity of the wireless signal received from the transponder 118 and estimate a distance from the body of the safety switch 1 to the actuator 2 based on the intensity of the wireless signal. The intensity of the wireless signal may be directly used for detecting the position of the actuator 2 instead of the distance. A safety determination circuit 144a of the first MCU 111 determines whether the measured distance is equal to or lower than a threshold or not and transmits a determination result to the second MCU 112. Similarly, a safety determination circuit 144b of the second MCU 112 determines whether the measured distance is equal to or lower than a threshold or not and transmits a determination result to the first MCU 111. The safety determination circuit 144a of the first MCU 111 determines that the actuator 2 is close to the body of the safety switch 1 (door closed state) when the determination result by itself corresponds to the determination by the other MCU (both determine that the measured distance is within the threshold). Similarly, the safety determination circuit 144b of the second MCU 112 determines that the actuator 2 is close to the body of the safety switch (door closed state) when the determination result by itself corresponds to the determination by the other MCU (both determine that the measured distance is within the threshold).

A demodulating section 142a of the first MCU 111 and a demodulating section 142b of the second MCU 112 respectively demodulate information carried by the wireless signal received from the transponder 118 and identify the actuator 2 based on the information. The information may include specific identification information. For example, identification information may differ in each actuator 2. For example, there is a case where plural actuators 2a and 2b installed in close positions as shown in FIG. 1C. When the safety switch 1b detects opening/closing of the door 101b based on the distance, the safety switch 1b may determine that the door 101b is closed even when the safety switch 1b is separated from the actuator 2b. That is because the actuator 2a exists close to the safety switch 1b. Accordingly, the safety switch 1 may detect (authenticate) the actuator 2 making a pair with the safety switch 1 itself based on the specific identification information. The safety switch 1 may recognize the actuator 2 making a pair with itself based on identification information and may measure the distance concerning the recognized actuator 2 in this manner. The safety determination circuit 144 may include a memory such as a ROM that stores identification information of the actuator 2 making a pair with itself to recognize the actuator 2.

A first OSSD 131 and a second OSSD 132 of a swiwtching device 130 may be configured by, for example, a PNP-type transistor. When the PNP-type transistor is turned on, a positive-side power supply is connected to an output terminal, therefore, an ON signal is outputted. On the other hand, when the PNP-type transistor is turned off, the output terminal is grounded through a pulldown resistance, therefore, an OFF signal is outputted. OSSD is an abbreviation of an output signal switching device.

The safety determination circuit 144a outputs the ON signal through the first OSSD 131 when the door closed state is detected. The ON signal may be called a safety state signal, a safety signal or an operation permission signal. Similarly, the safety determination circuit 144b outputs the ON signal through the second OSSD 132 of the switching device 130 when the door closed state is detected. The safety determination circuit 144a outputs the OFF signal through the first OSSD 131 when a door opened state is detected. The OFF signal may be called a non-safety state signal, a non-safety signal or an operation non-permission signal. The safety determination circuit 144b outputs the OFF signal through the second OSSD 132 when the door opened state is detected.

An OSSD monitoring circuit 119 may be connected to the first OSSD 131 and the second OSSD 132 respectively. The OSSD monitoring circuit 119 is connected to the first MCU 111 and the second MCU 112. The first MUC 111 monitors whether the operation of the second OSSD 132 is normal or not through the OSSD monitoring circuit 119. The second MUC 112 monitors whether the operation of the first OSSD 131 is normal or not through the OSSD monitoring circuit 119. For example, the first OSSD 131 and the second OSSD 132 respectively allow the output signal to make a transition to OFF periodically for a short period of time when outputting the ON signal. The OSSD monitoring circuit 119 determines that the OSSD is normal when OFF for a short period of time can be detected during the output period of the ON signal and determines that the OSSD is not normal when OFF for a short period of time is not capable of being detected. The case where the ON signal is continued is caused by short circuit between the output terminal and the positive-side power supply. In this case, the safety determination circuits 144a and 144b respectively output a control signal for outputting the OFF signal to the first OSSD 131 and the second OSSD 132. Accordingly, any of the first OSSD 131 and the second OSSD 132 which is normal outputs the OFF signal. External devices can operate only while both of the first OSSD 131 and the second OSSD 132 output the ON signal. Therefore, the external devices are not operate while at least one of the first OSSD 131 and the second OSSD 132 outputs the OFF signal. The external devices are configured not to respond to the OFF for a short period of time in the ON signal.

A power supply circuit 125 is a DC-DC converter receiving supply of DC+24V and 0V from the outside and generating DC voltages such as DC+10V, +5V or +3.3V. The power supply circuit 125 supplies electric power to all circuits requiring electric power such as the control circuit 110, the antenna coil 21a and the display unit 128. Incidentally, when a voltage supplied from an external power supply or a voltage outputted from the power supply circuit 125 is not within a prescribed range, there is a possibility that the control circuit 110 and the like do not operate normally. Accordingly, a power supply monitoring circuit 126 determines whether the voltage supplied from the external power supply is within a prescribed range or not as well as whether the voltage outputted from the power supply circuit 125 is within a prescribed range or not, outputting determination results to the first OSSD 131 and the second OSSD 132. The first OSSD 131 and the second OSSD 132 output the OFF signal respectively when the determination result indicating that the power supply circuit 125 does not operate normally is inputted, not depending on the control signal outputted from the control circuit 110. The first OSSD 131 and the second OSSD 132 output the ON signal or the OFF signal respectively when the determination result indicating that the power supply circuit 125 operates normally is inputted, depending on the control signal outputted from the control circuit 110.

An input circuit 120 includes a first safety input section 121 and a second safety input section 122. The first safety input section 121 and the second safety input section 122 are input circuits for being connected to other safety switches 1 in daisy chain (cascade connection). For example, the first safety input section 121 and the second safety input section 122 are respectively connected to a first OSSD 131 and a second OSSD 132 of another safety switch 1. In a case where a plurality of doors are provided with respect to iron fences surrounding a hazard source, the hazard source is not capable of operating as far as all doors are in the safety state. The first MCU 111 is connected to the first safety input section 121. The first MCU 111 controls the first OSSD 131 based on the open/close state of the actuator 2 when the ON signal is inputted through the first safety input section 121. The first MCU 111 allows the first OSSD 131 to output the OFF signal when the OFF signal is inputted through the first safety input section 121, not depending on the open/close state of the actuator 2. Similarly, the second MCU 112 is connected to the second safety input section 122. The second MCU 112 controls the second OSSD 132 when the ON signal is inputted through the second safety input section 122 based on the open/close state of the actuator 2. The second MCU 112 allows the second OSSD 132 to output the OFF signal when the OFF signal is inputted through the second safety input section 122, not depending on the open/close state of the actuator 2. Accordingly, the cascade connection of the plural safety switches 1 can be performed. When any of the plural safety switch 1 is not in the safety state, the OFF signal is outputted to external devices. When all the plural safety switches 1 are in the safety state, the ON signal is outputted to external devices.

The control circuit 110 may include an EDM function and an interlock (manual reset) function. EDM is an abbreviation of External Device Monitoring. The EDM function is a function of monitoring a contact welding of external devices (example: a conductor, relay and so on). In the EDM function, the ON signal is not outputted while welding of the external device occurs. The interlock function is a function of preventing the OSSD output from being changed from the OFF signal to the ON signal against intention of a user. The control circuit 110 keeps the OSSD output in the OFF signal when the state is changed into the interlock state even in a case where the hazard source managed by the safety switch 1 is in the safety state. The control circuit 100 releases the interlock state when detecting that a release button is pressed.

A display control unit 143 allows the large display lamp 91a to be lit green when the door closed state is detected and allows the large display lamp 91a to be lit red when the door opened state is detected. The display control unit 143 also allows the small display lamp 91b to be lit green when the first OSSD 131 and the second OSSD 143 output the ON signal, and allows the small display lamp 91b to be lit red when any of the first OSSD 131 and the second OSSD 132 outputs the OFF signal. The display control unit 143 turns off the small display lamp 91c when a signal is inputted to the input circuit 120 from the outside and allows the small display lamp 91c to be lit orange when a signal is not inputted to the input circuit 120 from the outside. The display control unit 143 allows the small display lamp 91d to be lit red when the control circuit 110 detects some kind of error.

<Modification Example of Actuator>

Figure 14A:
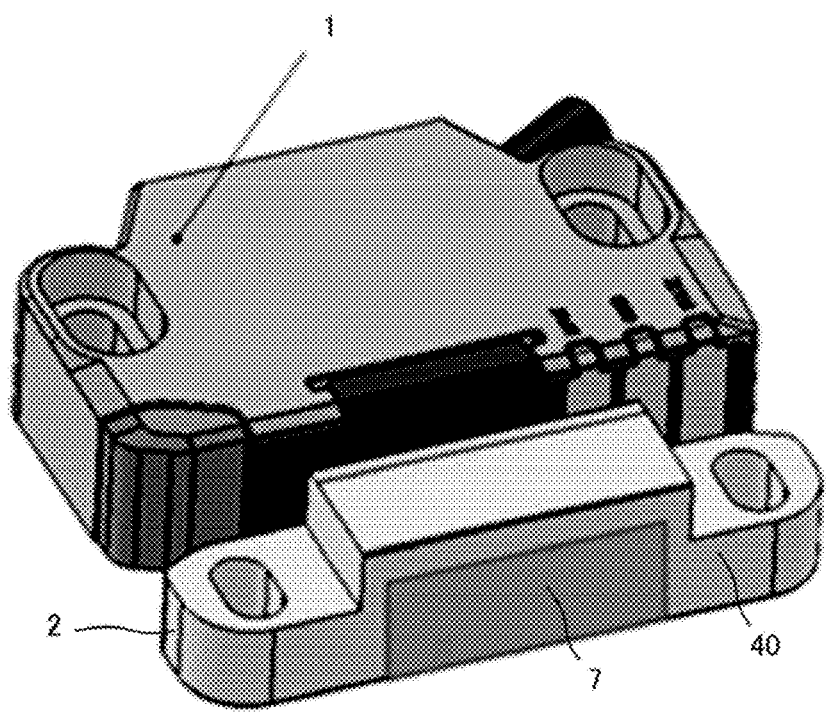
FIGS. 14A and 14B are views showing a modification example of the actuator.
Figure 14B:
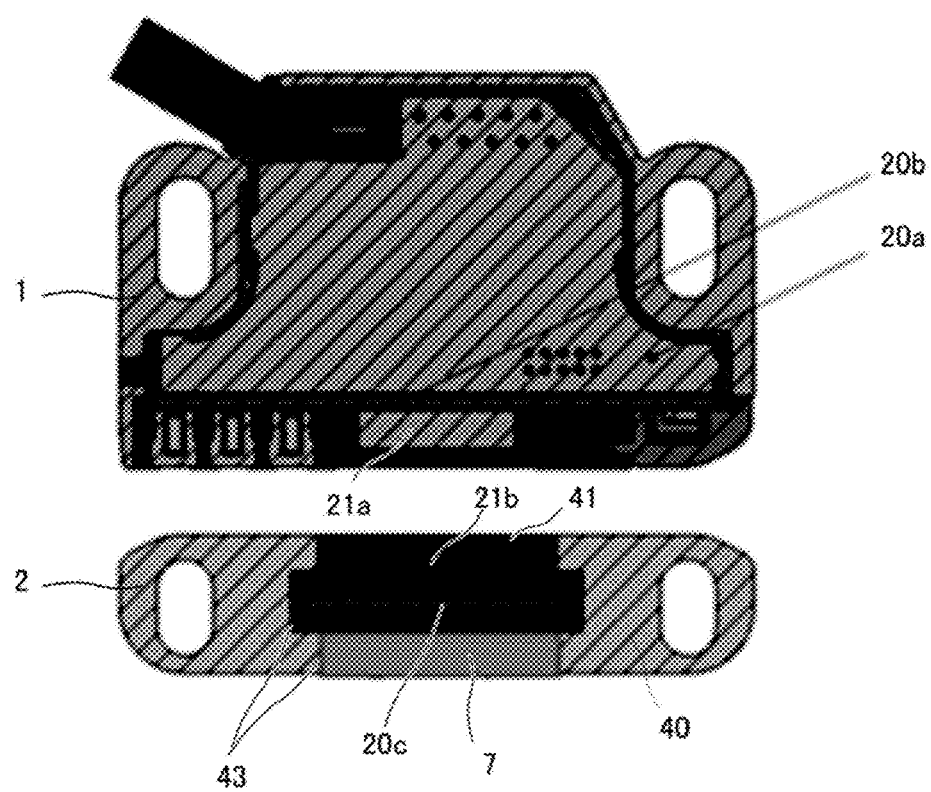

FIG. 14A and FIG. 14B show a modification example of the actuator 2. Though the back surface of the actuator 2 is covered with metal in the above-described embodiment, the back surface made of metal may act on the antenna coil 21b electromagnetically and may reduce reception sensitivity of the antenna coil 21b. Accordingly, it is preferable that part of the back surface of the casing 40 of the actuator 2 is cut out and a cover member 7 made of resin is fitted to a cutout portion. The reduction in reception sensitivity of the antenna coil 21b will be suppressed by the above structure. The cutout portion may be formed integrally with the groove portion 43. In this case, the groove portion 43 has an opening also on the back surface of the casing 40. The cover member 7 may also be integrated with the circuit case 41.

Incidentally, a radiation pattern of electromagnetic waves in the antenna coils 21a and 21b includes a main lobe and side lobes. The effect given to wireless communication between the antenna coils 21a and 21b by the side lobes depends on antenna characteristics of the antenna coils 21a and 21b. For example, wireless communication between the antenna coils 21a and 21b may be improved by blocking the side lobes. For example, a magnetic metal (magnetic shield) may be arranged as a shielding means around the antenna coils 21a and 21b. For example, the magnetic metal may be adopted as a metal used for the casing 40 of the actuator 2. Moreover, a material such as resin which hardly attenuates signal intensities may be adopted in a first front surface area and a back surface area corresponding to the main lobe of the antenna coil 21b. Metal may be adopted at least in second front surface areas corresponding to side lobes of the antenna coil 21b. According to this, the distance from the surface of the casing 40 to antenna coil 21b can be shortened without regarding to the side lobes. Additionally, both size reduction and toughness of the actuator 2 can be realized.

It is sufficient that the above magnetic shield is provided at least any of the body case 4 of the safety switch 1 and the casing 40 of the actuator 2. When the casing 40 of the actuator 2 is formed of the magnetic metal (magnetic shield), the body case 4 may be formed of non-magnetic metal. Accordingly, excessive attenuation in the signal intensity will be suppressed. In the present embodiment, the large display lamp 91, the small display lamps 91b to 91d and the like are provided on the front surface side of the safety switch 1. As it is difficult to cover the large display lamp 91 and the small display lamps 91b to 91d with the magnetic field, the casing 40 of the actuator 2 is formed of the magnetic metal (magnetic shield). It is also preferable that the casing 40 of the actuator 2 is made of resin and that a sheet metal of magnetic metal is provided in the second front surface areas of the antenna coil 21b corresponding to the side lobes.

SUMMARY

As shown in FIG. 2, the body case 4 is an example of a metallic casing. The antenna coil 21a, the transmission circuit 116 and the receiving circuit 117 correspond to an example of a wireless communication means provided inside the casing and wirelessly supplying electric power to the wireless tag attached to the door and performing communication with the wireless tag. The antenna coil 21a, the transmission circuit 116 and the receiving circuit 117 correspond to an example of a wireless means wirelessly supplying electric power to the wireless tag and receiving the signal including identification information from the wireless tag. The actuator is an example of a wireless tag. The control circuit 110 is an example of a determination means provided inside the casing and determining whether the door is in the opened state or in the closed state in accordance with information received from the wireless tag and the intensity of the signal received from the wireless tag. The control circuit 110 is also an example of a determination means for determining whether a predetermined wireless tag exists within a reference range or not in accordance with identification information included in the signal received from the wireless tag by the wireless means and the intensity of the signal received from the wireless tag. The switching device 130 corresponds to an example of plural output means provided inside the casing and outputting a safety signal based on a determination result by the determination means. The opening 14 is an example of an opening provided on the front surface as an outer surface facing the wireless tag when the door is closed in a plurality of outer surfaces forming the metallic casing of the body of the safety switch 1. The opening 14 is an example of an opening formed on the front surface as a first outer surface in plural outer surfaces forming the metallic casing or the body of the safety switch 1 so as to correspond to a wireless route by the wireless means. It is also preferable that the entire first outer surface is the opening 14. The cover member 6 is an example of a cover member covering the opening, through which electromagnetic waves transmitted and received by the wireless communication means (wireless means) pass. The circuit substrates 20a and 20b are examples of one or more circuit substrates provided inside the casing and the cover member, on which the wireless means, the determination means and the output means are mounted. The attachment holes 10a and 10b are examples of attachment holes formed on side surfaces as second outer surfaces adjacent to the front surface in plural outer surfaces forming the metallic casing or the body of the safety switch 1 for attaching the casing. As the metallic casing is adopted in the present embodiment, toughness of the non-contact type safety switch is improved.

The hot melt or the like is an example of a filling resin to be filled inside the casing. Accordingly, the circuit substrates 20a and 20b can be positioned easily.

The filling holes 8a and 8b are examples of filling holes provided in the casing and used for filling the inside of the casing with the filling resin. When the filling holes 8a and 8b are adopted in this manner, the circuit substrates 20a and 20b can be easily positioned by the filling resin after the circuit substrates 20a and 29b are housed inside the casing.

As shown in FIG. 3B, the filling hole 8a may be provided on an outer surface not adjacent to the front surface in plural outer surfaces forming the metallic casing or the body of the safety switch 1.

As shown in FIG. 4, notches 13a to 13d are examples of notches provided on the side surface as at least one outer surface adjacent to the front surface in plural outer surfaces forming the metallic casing or the body of the safety switch 1 and communicating with the opening. The cover member 6 may be formed so as to cover the opening 14 and the notches 13b.

The large display lamp 91 and the small display lamp 91b correspond to an example of a first display lamp provided over the front surface and at least one side surface adjacent to the front surface in plural outer surfaces and being turned on/off in conjunction with the safety signal.

The small display lamp 91d may function as a second display lamp provided over the front surface and at least one side surface adjacent to the front surface and being turned on/off according to whether plural output means normally operate or not.

The first MCU 111 and the second MCU 112 correspond to an example of a generation circuit generating the safety signal based on an input signal inputted from the outside and a determination result of the determination means. The small display lamp 91c is an example of a third display lamp provided over the front surface and at least one side surface adjacent to the front surface and being turned on/off in accordance with a state of the input signal.

The attachment holes 94a and 94b provided on the cover member 6 correspond to an example of a first attachment hole (first display hole) in which the first display lamp is provided. The attachment holes 94c and 94d provided in the cover member 6 are respectively an example of a second attachment hole (second display hole) in which the second display lamp is provided and an example of a third attachment hole (third display hole) in which the third display lamp is provided.

The attachment hole 94a as the first display hole may be provided so as to sandwich the opening 14 with respect to the second display hole and the third display hole.

The attachment holes 10a and 10b are examples of holes provided in the casing, into which attaching tools (example: attachment screws 72a and 72b) for attaching the casing to the door frame are inserted.

As shown in FIG. 11A and so on, attachment surfaces as outer surfaces facing the door frame in plural outer surfaces forming the metallic casing or the body of the safety switch 1 correspond to second outer surfaces. A cross-sectional shape of holes (attachment holes 10a and 10b) of which sections are planes parallel to the second outer surfaces may be a rounded rectangular shape. Accordingly, the safety switch 1 can be easily fixed to aluminum frames or the like of plural different sizes.

As shown in FIG. 3D, the outer surface existing on the opposite side of the front surface in plural outer surfaces forming the metallic casing or the body of the safety switch 1 has the slope area not parallel to the front surface. The slope area may have the hole area (example: cable hole 12) into which the cable 11 outputting the safety signal is inserted.

What is claimed is:
1. A safety door switch comprising:
 a metallic casing integrated as a first part of an enclosure, having an opening in a front side;

a cover integrated as a front part of the enclosure, covering the opening, the cover having a surface as a front surface of the enclosure;

a wireless means disposed in the enclosure, for wirelessly supplying electric power to a wireless tag and receiving a signal including identification information from the wireless tag through the cover;

a determination means disposed in the enclosure, for determining whether a predetermined wireless tag exists in a reference range or not in accordance with identification information included in the signal received from the wireless tag by the wireless means and an intensity of the signal received from the wireless tag;

an output means disposed in the enclosure, for outputting a safety signal based on a determination result of the determination means;

one or more circuit substrates provided inside the metallic casing and the cover, on which the wireless means, the determination means and the output means are mounted; and attachment holes formed on a side surface of the metallic casing, the side surface being adjacent to the front surface of the enclosure for attaching the casing.

2. The safety door switch according to claim 1, further comprising:

a filling resin filled inside the casing.

3. The safety door switch according to claim 2, further comprising:

a filling hole provided in the casing and used for filling the inside of the casing with the filling resin.

4. The safety door switch according to claim 3, wherein the filling hole is provided on an outer surface of the metallic casing, the outer surface not being adjacent to the front surface of the enclosure.

5. The safety door switch according to claim 1, further comprising:

a notch formed on the side surface of the metallic casing and continuously formed with the opening, wherein the cover covers both the opening and the notch.

6. The safety door switch according to claim 1, further comprising:

a first display lamp disposed over the front surface and at least one side surface adjacent to the front surface and being turned on/off in conjunction with the safety signal.

7. The safety door switch according to claim 6, further comprising:

a second display lamp disposed over the front surface and at least one side surface adjacent to the front surface and being turned on/off according to whether the output means normally operates or not.

8. The safety door switch according to claim 6, further comprising:

a generation circuit generating a safety signal based on an input signal inputted from the outside and a determination result of the determination means; and a third display lamp disposed over the front surface and at least one side surface adjacent to the front surface and being turned on/off in accordance with a state of the input signal.

9. The safety door switch according to claim 8, wherein the cover includes a first display hole in which the first display lamp is provided, a second display hole in which the second display lamp is provided, and a third display hole in which the third display lamp is provided.

10. The safety door switch according to claim 9, wherein the first display hole is provided so as to sandwich the opening with respect to the second display hole and the third display hole.

11. The safety door switch according to claim 1, wherein a cross-sectional shape of the attachment holes of which sections are planes parallel to the second outer surfaces is a rounded rectangular shape.

12. The safety door switch according to claim 1, wherein an outer surface of the metallic casing on the opposite side of the front surface of the enclosure has a slope area not parallel to the front surface, and the slope area has a hole area into which a cable outputting the safety signal is inserted.

* * * * *